(12) United States Patent
Von Kaenel

(10) Patent No.: US 8,647,434 B2
(45) Date of Patent: Feb. 11, 2014

(54) SYSTEM AND PROCESS FOR HIGH-DENSITY, LOW-ENERGY PLASMA ENHANCED VAPOR PHASE EPITAXY

(75) Inventor: Hans Von Kaenel, Zürich (CH)

(73) Assignee: Sulzer Metco AG, Wohlen (CH)

( * ) Notice: Subject to any disclaimer, the term of this patent is extended or adjusted under 35 U.S.C. 154(b) by 1649 days.

(21) Appl. No.: 11/817,208

(22) PCT Filed: Feb. 28, 2006

(86) PCT No.: PCT/IB2006/000421
§ 371 (c)(1),
(2), (4) Date: Aug. 27, 2007

(87) PCT Pub. No.: WO2006/097804
PCT Pub. Date: Sep. 21, 2006

(65) Prior Publication Data
US 2008/0152903 A1    Jun. 26, 2008

Related U.S. Application Data
(60) Provisional application No. 60/657,208, filed on Feb. 28, 2005.

(51) Int. Cl.
*C30B 33/00*    (2006.01)
(52) U.S. Cl.
USPC ......... 117/104; 117/108; 117/109; 118/715 R
(58) Field of Classification Search
USPC .................. 117/104, 108, 109; 118/715 R
See application file for complete search history.

(56) References Cited

U.S. PATENT DOCUMENTS

| 4,368,092 A | 1/1983 | Steinberg et al. |
| 4,948,458 A | 8/1990 | Ogle |

(Continued)

FOREIGN PATENT DOCUMENTS

| JP | 61-53719 | 3/1986 |
| JP | 7-288237 | 10/1995 |

(Continued)

OTHER PUBLICATIONS

Brown et al, "AlGaN/GaN HFETs fabricated on 100-mm GaN on silicon (111) substrates", Solide-State Electronics, vol. 46, No. 10 (Oct. 2002), pp. 1535-1539.

(Continued)

*Primary Examiner* — Bob M Kunemund
(74) *Attorney, Agent, or Firm* — Da Vinci Partners LLC; John Moetteli

(57) ABSTRACT

An apparatus and process for fast epitaxial deposition of compound semiconductor layers includes a low-energy, high-density plasma generating apparatus for plasma enhanced vapor phase epitaxy. The process provides in one step, combining one or more metal vapors with gases of non-metallic elements in a deposition chamber. Then highly activating the gases in the presence of a dense, low-energy plasma. Concurrently reacting the metal vapor with the highly activated gases and depositing the reaction product on a heated substrate in communication with a support immersed in the plasma, to form a semiconductor layer on the substrate. The process is carbon-free and especially suited for epitaxial growth of nitride semiconductors at growth rates up to 10 nm/s and substrate temperatures below 1000° C. on large-area silicon substrates. The process requires neither carbon-containing gases nor gases releasing hydrogen, and in the absence of toxic carrier or reagent gases, is environment friendly.

23 Claims, 5 Drawing Sheets

(56) References Cited

U.S. PATENT DOCUMENTS

| | | | |
|---|---|---|---|
| 5,580,420 | A | 12/1996 | Watanabe et al. |
| 5,633,192 | A | 5/1997 | Moustakas et al. |
| 5,783,101 | A | 7/1998 | Ma et al. |
| 5,788,799 | A | 8/1998 | Steger et al. |
| 6,454,855 | B1 | 9/2002 | Von Kaenel et al. |
| 6,472,300 | B2 | 10/2002 | Nikolaev et al. |
| 6,706,119 | B2 | 3/2004 | Tsvetkov et al. |
| 6,811,611 | B2 | 11/2004 | Johnson |
| 6,818,061 | B2 | 11/2004 | Peczalski et al. |
| 6,918,352 | B2 | 7/2005 | Von Kaenel et al. |
| 6,992,011 | B2 | 1/2006 | Nemoto et al. |

FOREIGN PATENT DOCUMENTS

| | | |
|---|---|---|
| WO | WO 96/22408 | 7/1996 |
| WO | WO 01/65590 | 9/2001 |
| WO | WO 2006/000846 | 1/2006 |

OTHER PUBLICATIONS

Nakamura, "InGaN-based laser diodes", Annual Reviews on Material Science, vol. 28 (1998), pp. 125-152.

Nakamura, "The roles of structural imperfections in InGaN-based blue light-emitting diodes and laser diodes", Science, vol. 281 (Aug. 14, 1998), pp. 956-961.

Smith et al, "341 nm emission from hydride vapor-phase epitaxy ultraviolet light emitting diodes", Journal of Applied Physics, vol. 95, No. 12 (Jun. 15, 2004), pp. 8247-8251.

Davis et al, "Gallium nitride materials—progress, status, and potential roadblocks", Proceedings of the IEEE, vol. 90, No. 6 (Jun. 2002), pp. 993-1004.

Dadgar et al, "Metalorganic chemical vapor phase epitaxy of gallium-nitride on silicon", physica status solidi (c), vol. 0, No. 6 (Sep. 2003), pp. 1583-1606.

Wang et al, "Electron mobility exceeding 10 cm2/V in an AlGaN-GaN heterostructure grown on a sapphire substrate", Applied Physics Letters, vol. 74, No. 23 (Jun. 7, 1999), pp. 3531-3533.

Blaesing et al., "The origin of stress reduction by low-temperature AlN interlayers", Applied Physics letters, vol. 81, No. 15 (Oct. 7, 2002), pp. 2722-2724.

Elsass, "Electron transport in AlGaN/GaN heterostructures grown by plasma-assisted molecular beam epitaxy", Japanese Journal of Applied Physics, vol. 39, Part 2, No. 10B(Oct. 15, 2000), pp. L1023-L 1025.

Rosenblad et al, "Silicon epitaxy by low-energy plasma enhanced chemical vapor deposition", Journal of Vacuum Science and Technology A, vol. 16, No. 5 (Sep./Oct. 1998), pp. 2785-2790.

Tae et al, "Low-temperature silicon homoepitaxy by ultrahigh vacuum electron cyclotron resonance chemical vapor deposition", Applied Physics Letters, vol. 64, No. 8 (Feb. 21, 1994), pp. 1021-1023.

Vartuli et al, "ICl/Ar electron cyclotron resonance plasma etching of III-V nitrides", Applied Physics Letters, vol. 69, No. 10 (Sep. 2, 1996), pp. 1426-1428.

Collison et al, "Studies of the low-pressure inductively-coupled plasma etching for a larger wafer using plasma modeling and Langmuir probe", Jornal of Vacuum Science and Technology A, vol. 16, No. 1 (Jan./Feb. 1998), pp. 100-107.

Shul et al, "Inductively coupled plasma etching of GaN", Applied Physics Letters, vol. 69 No. 8 (Aug. 19, 1996), pp. 1119-1121.

Hopwood, "Review of inductively coupled plasmas for plasma processing", Plasma Source Science and Technology, vol. 1, No. 2 (May 1992), pp. 109-116.

Green et al, "Carbon doping of GaN with CBr4 in radio-frequency plasma-assisted molecular beam epitaxy", Journal of Applied Physics, vol. 95, No. 12 (Jun. 15, 2004), pp. 8456-8462.

Känel, "Very high hole mobilities in modulation-doped Ge quantum wells grown by low-energy plasma enhanced chemical vapor deposition", Applied Physics Letters, vol. 80, No. 16 (Apr. 22, 2002), pp. 2922-2924.

Sutter et al, Quantum transport in sputtered, epitaxial Si/Si, *Ge* heterostructures, Applied Physics Letters, vol. 67, No. 26 (Dec. 25, 1995), pp. 3954-3956.

Rubin et al., p-type gallium nitride by reactive ion-beam molecular beam epitaxy with ion implantation, diffusion, or coevaporation of Mg, Appl. Phys. Lett., Jan. 3, 1994, p. 64-66, vol. 64, No. 1, American Institute of Physics.

Lei et al., Epitaxial growth of zinc blende and wurtzitic gallium nitride thin films on (001) silicon, Appl. Phys. Lett., Aug. 19, 1991, p. 944-946, vol. 59, No. 8, American Institute of Physics.

Ohtani et al., Microstructure and photoluminescence of GaN grown on Si (111) by plasma-assisted molecular beam epitaxy, Appl. Phys. Lett., Jul. 4, 1994, p. 61-63, vol. 65, No. 1, American Institute of Physics.

SYSTEM AND PROCESS FOR HIGH-DENSITY, LOW-ENERGY PLASMA ENHANCED VAPOR PHASE EPITAXY

RELATED APPLICATIONS

This application is a US National Stage of PCT application claiming priority to U.S. Provisional Application Ser. No. 60/657,208, filed 28 Feb. 2005, the content of which is incorporated by reference.

FIELD OF THE INVENTION

This invention is in the field of epitaxy growth processes and coating apparatuses. More specifically, the present invention relates to apparatuses and processes for epitaxy forming of a single crystal by deposition of material directly from the vapor or gaseous state.

BACKGROUND OF THE INVENTION

The III-V compound semiconductor Gallium Nitride (GaN) and its Aluminum (Al) and Indium (In) alloys are ideal materials both for high-frequency and high-power electronic applications (see for example Brown et al., Solid-State El. 46, 1535 (2002), the content of which is incorporated herein by reference thereto). These materials are also ideal for short wavelength light emitting diodes and lasers (see for example Nakamura, Annu. Rev. Mater. Sci. 28, 125 (1998); Nakamura, Science 281, 956 (1998); and Smith et al., J. Appl. Phys. 95, 8247 (2004), the contents of which are incorporated herein by reference thereto).

One of the main drawbacks of the material is, however, the lack of large, single crystals due to extreme conditions of high temperature and pressure required for their growth in bulk form. The only way to synthesize GaN wafers of significant size is by means of heteroepitaxy, whereby thick, self-supporting GaN layers are grown onto a support substrate such as sapphire or Silicon Carbide (SiC), which substrate is subsequently removed. Thinner heteroepitaxial III-V nitride layers can be used for device processing without removal of the substrate.

One common problem of all techniques used for heteroepitaxial growth of GaN is the high dislocation density initially present in the growing layers. This problem results from the different lattice parameters of GaN and the available substrate materials, such as sapphire, silicon carbide and silicon (see for example Dadgar et al., Phys. Stat. Sol. (c) 0, 1583 (2003), the content of which is incorporated by reference thereto). As a consequence of the high misfit dislocation density, heteroepitaxial GaN layers tend to contain also high density of threading dislocations (TD), which degrade device performance whenever they penetrate into any active layers. Many ways have been devised to reduce TD densities to values acceptable for device fabrication, such as buffer layer growth of various forms, or lateral overgrowth with and without the use of masks (see for example Davis et al., Proc. IEEE 90, 993 (2002), the content of which is incorporated by reference thereto).

The main methods used for growing epitaxial III-V nitride layers are hydride vapor phase epitaxy (HVPE), metal-organic chemical vapor deposition (MOCVD) and molecular beam epitaxy (MBE). In HVPE, pure metals are used as source materials, and transported as gaseous halides to the reaction zone where they react with a nitrogen-containing gas, usually $NH_3$ to form an epitaxial layer on a substrate typically heated to above 1000° C. HVPE has the advantage of very high growth rates of up to 100 μm/h (see for example U.S. Pat. No. 6,472,300 to Nikolaev et al., the content of which is incorporated herein by reference). Because of its high growth rates, HVPE is mostly used for growing layers many tens of microns thick, and in particular for the fabrication of self-supporting layers as substrates for subsequent MOCVD or MBE steps.

Low rates and control of sharp interfaces are, however, more difficult to achieve by HVPE, and may require mechanical movement of the substrate between different reactor zones (see for example U.S. Pat. No. 6,706,119 to Tsvetkov et al., the content of which is incorporated herein by reference). Additionally, the presence of hydrogen gas in the reaction zone requires annealing of the substrate in an inert gas atmosphere, particularly when high p-type doping for example by Mg impurities is to be attained (see for example U.S. Pat. No. 6,472,300 to Nikolaev et al., the content of which is incorporated herein by reference).

MOCVD (or MOVPE, for "metal-organic vapor phase epitaxy") is a CVD technique in which metal-organic precursors are used along with other reactive gases containing the anions, such as ammonia in the case of nitride growth. The need for expensive precursor gases, along with rather low growth rates of just a few units, is a significant disadvantage of MOCVD. Furthermore, a buffer layer usually has to be grown for GaN heteroepitaxy on sapphire, SiC or Si, at a lower substrate temperature before the active layer stacks are deposited at temperatures above 1000° C. (see for example U.S. Pat. No. 6,818,061 to Peczalski et al. the content of which is incorporated herein by reference). MOCVD is, however, the technique most often used for growing active layer structures suitable for device fabrication (see for example Wang et al., Appl. Phys. Lett. 74, 3531 (1999) and Nakamura, Science 281, 956 (1998) the contents of which are incorporated herein by reference).

Large differences in thermal expansion coefficients between common substrates and GaN, together with the high substrate temperature during growth, present a significant obstacle towards achieving crack-free epitaxial layers. Crack avoidance seems to necessitate rather complicated interlayer schemes (see for example Bläsing et al., Appl. Phys. Lett. 81, 2722 (2002) the content of which is incorporated herein by reference). HVPE and MOCVD are both deposition techniques working at atmospheric or somewhat reduced pressures. Reactor geometries and gas flows determine layer uniformities to a large extent.

By contrast, in MBE, pressures are in the high-vacuum to ultrahigh-vacuum range and mean-free paths therefore greatly exceed reactor dimensions. Metals are evaporated in so-called effusion cells from which molecular or atomic beams travel towards the heated substrate without being scattered in the gas phase. For nitride growth, a nitrogen source yielding activated nitrogen must be used. Activation is usually achieved by means of plasma excitation of molecular nitrogen. A system for epitaxially growing Gallium Nitride layers with a remote electron-cyclotron-resonance (ECR) plasma source for nitrogen activation has been described for example in U.S. Pat. No. 5,633,192 to Moustakas et al., the content of which is incorporated herein by reference. Since Gallium (Ga) is usually supplied from an effusion cell, MBE does not require the expensive metal-organic precursors common in MOCVD. MBE offers moreover excellent control over layer composition and interface abruptness (see for example Elsass et al, Jpn. J. Appl. Phys. 39, L1023 (2000); the content of which is incorporated herein by reference). Due to its low growth rates on the order of 1 μm/h and complex equipment, however, it is not considered to be a technique suitable for large scale production of semiconductor heterostructures.

A further method potentially suitable for large scale production of nitride semiconductors (see, for example, U.S. Pat. No. 6,454,855 to von Känel et al. the contents of which is incorporated herein by reference) is low-energy plasma enhanced chemical vapor deposition (LEPECVD). In contrast to plasma assisted MBE, where nitrogen activation occurs in a remote plasma source, a dense low-energy plasma is in direct contact with the substrate surface in LEPECVD. The low-energy plasma is generated by a DC arc discharge by means of which metalorganic precursors and nitrogen are activated (see, for example, U.S. Pat. No. 6,918,352 to von Känel et al. the content of which is incorporated herein by reference). Potentially, LEPECVD can reach growth rates comparable to those of HVPE (several tens of µm/h, while offering optimum control over the dynamic range of growth rates, such that excellent interface quality can be achieved. Moreover, since activation of the reactive precursors is achieved by means of a plasma rather than thermally, the process is expected to work at lower substrate temperatures. The DC plasma source used in LEPECVD has been shown to be scalable to 300 mm substrates (see for example WO 2006/000846 to von Känel et al., the content of which is incorporated herein by reference).

Although the term "LEPECVD" has been coined in conjunction with a DC arc discharge (see, Rosenblad et al., J. Vac. Sci. Technol. A 16, 2785 (1998), the content of which is incorporated herein by reference), such a DC arc discharge is not the only way to generate a low-energy plasma suitable for epitaxy. According to prior art, sufficiently low-energy ions suitable for epitaxial growth may result also from electron-cyclotron-resonance (ECR) plasma sources (see Heung-Sik Tae et al., Appl. Phys. Lett. 64, 1021 (1994), the content of which is incorporated herein by reference). An ECR plasma source potentially suitable for epitaxial growth by plasma enhanced CVD on large area substrates has been described, for example, in U.S. Pat. No. 5,580,420 to Katsuya Watanabe et al., the content of which is incorporated herein by reference. In industrial semiconductor processing, large ECR sources are, however, used for etching rather than epitaxy. Very high etch rates have been achieved in the case of III-V nitrides (see for example, Vartuli et al., Appl. Phys. Lett. 69, 1426 (1996), the content of which is incorporated herein by reference).

Yet other sources of high-density, low-energy plasmas are inductively coupled plasma (ICP) sources. These sources have a number of advantages over ECR sources, such as easier scaling to large wafer diameters and lower costs. For a review of the different kinds of ICP sources, see Hopwood, Plasma Sources Sci. Technol. 1, 109 (1992), the content of which is incorporated herein by reference. The most common variants used for plasma processing are helical inductive couplers where a coil is wound around the plasma vessel (for example, see Steinberg et al., U.S. Pat. No. 4,368,092, the content of which is incorporated herein by reference), and spiral inductive couplers with flat coils in the form of a spiral (for example, see U.S. Pat. No. 4,948,458 to Ogle, the content of which is incorporated herein by reference). Plasma sources based on spiral couplers have the advantage of higher plasma uniformity, facilitating scaling to large substrate sizes (for example, see Collison et al., J. Vac. Sci. Technol. A 16, 100 (1998), the content of which is incorporated herein by reference).

While ICP sources normally are operated at a frequency of 13.56 MHz, operating at lower frequency has been shown to decrease capacitive coupling and thus leading to even lower ion energies (see U.S. Pat. No. 5,783,101 to Ma et al., the content of which is incorporated herein by reference).

Both, ECR sources and ICP sources are usually used for etching. Very high etch rates for GaN have been obtained also with ICP sources (see Shul et al., Appl. Phys. Lett. 69, 1119 (1996), the content of which is incorporated herein by reference). However, use of these sources for epitaxial growth of semiconductor quality materials is very rare. Recently, it has been suggested to apply an electrically-shielded ICP source for ion plating epitaxial deposition of silicon. This method has the obvious drawback of requiring a metallic collimator inside the deposition chamber (see U.S. Pat. No. 6,811,611 to Johnson, the content of which is incorporated herein by reference).

ICP sources can also be used for efficient cleaning of process chambers, such as chambers used for thermal CVD, where a remote plasma source is usually employed (see U.S. Pat. No. 5,788,799 to Steger, the content of which is incorporated herein by reference). Chamber cleaning is particularly important for semiconductor processing, where particulate contamination has to be kept as low as possible. Processing chambers equipped with a plasma source, such as an ICP source, do not of course require an additional remote source for efficient cleaning (see U.S. Pat. No. 6,992,011 to Nemoto et al., the content of which is incorporated herein by reference).

Whatever plasma source is used for generating a low-energy plasma for plasma enhanced chemical vapor deposition, when applied to III-V compound semiconductor growth, carbon incorporation into the growing layers is likely to occur to a much greater extent than in MOCVD. Carbon incorporation results from the use of organic precursors in MOCVD and as suggested for LEPECVD (see U.S. Pat. No. 6,454,855 to von Känel et al. the content of which is incorporated herein by reference). The intense plasma used for cracking the precursors in LEPECVD is expected to greatly enhance unintentional carbon uptake, possibly to a degree unacceptable for device applications, since carbon acts as a dopant (see, for example, Green et al., J. Appl. Phys. 95, 8456 (2004), the content of which is incorporated herein by reference).

It is an objective of the present invention to avoid the drawbacks of prior art techniques mentioned above, such as carbon and hydrogen incorporation, high substrate temperatures, and low deposition rates. An additional major limitation of prior art techniques is a relatively small wafer size (two inch in production, up to 6 inch demonstrated for sapphire substrates). Increased scaling of silicon wafers of up to 300 mm (or more) is one of the objects of the present invention.

SUMMARY OF THE INVENTION

The present invention is a new low-energy, high density apparatus and a process for fast epitaxial deposition of compound semiconductor layers on to a semiconductor support substrate. The invention provides for the deposition of a large variety of compound layers by being able to controllably alter constituent reagents and/or their concentrations during the deposition process. In a first step of the process, one or several metals are vaporized, and the metal vapors are injected into the interior of the deposition chamber of the apparatus. Vaporization can be accomplished using, for example, effusion cells or sputter targets communicating with the interior of the deposition chamber. Concurrently, upon injection of the metal vapor (e.g., Gallium) into the chamber, a non-metallic and normally non-reactive, non-toxic gas (Nitrogen as $N_2$) is also injected into the chamber. In a second substantially concurrent step, a dense, low-energy plasma is generated and maintained in the deposition chamber by any of a plurality of plasma generating mechanisms (such as an electron-cyclotron-resonance (ECR) plasma, an inductively coupled plasma (ICP) or a DC arc discharge plasma). When fully immersed in the plasma, the non-metallic gas becomes highly activated, and reacts with the metal vapor and forms an epitaxial semiconductor layer (e.g., GaN) on a heated semiconductor substrate supported in the plasma. The invention provides a carbon-free process, because of the absence of organic precursor reagents, and is especially well suited for application to producing semiconductor layers on large-area silicon substrate. Additionally, in the absence of any toxic carrier or reagent gases, the process is also extraordinarily environment friendly.

DETAILED DESCRIPTION OF THE INVENTION

The present invention is a system including an apparatus and process for the epitaxial growth of III-V semiconductors, especially group III-nitrides, such as GaN, GaAlN, and GaInN. The apparatus provides a low-energy, high-density plasma for plasma enhanced vapor phase epitaxy of semiconductor layers on to a semiconductor support. The present system allows for the economical fabrication of heterostructures suitable for high-frequency power amplifiers, violet, blue and white LEDs (lighting), and blue and ultra-violet semiconductor lasers.

Figure 1:
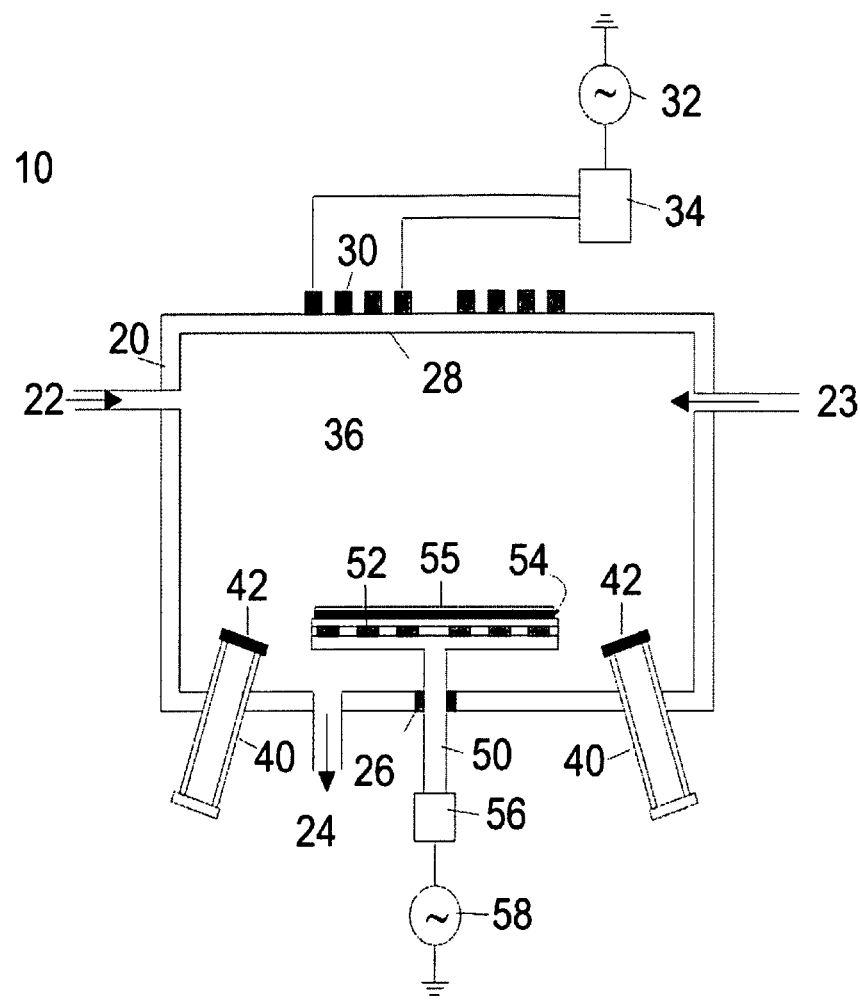
FIG. 1 is a schematic side-view drawing of the system for low-energy plasma-enhanced vapor phase epitaxy (LEPEVPE) with an inductively coupled plasma (ICP) source and effusion cells.

Referring now to FIG. 1, the apparatus 10 includes a vacuum deposition chamber 20 having a chamber interior 21 communicating with a vacuum pumping system (not shown), such as a turbomolecular pump, attached to exhaust line 24. The deposition chamber 20 and the pumping system are chosen such as to being compatible with ultra-clean processing of semiconductors. For example a system allowing for ultra-high vacuum in the absence of process gases has been found to be adequate. Inert and normally non-reactive gases, such as argon and nitrogen, and any additional gases suitable for processing, are supplied to the deposition chamber 20 by means of gas inlets 22. Nitrogen in the form of $N_2$ is normally a non-reactive gas. However, when exposed to the field of the present apparatus, the $N_2$ nitrogen is converted to its atomic form N and becomes highly activated and reactive. The deposition chamber 20 is equipped with a dielectric window 28 through which radio frequency waves are coupled into the chamber interior 21 by means of a spiral coil assembly 30. The spiral coil assembly 30 communicates with an impedance matching network 32 and a radio frequency generator 34. Radio frequency waves emanating from the spiral coils excite a dense, low-energy plasma within the interior 21 of the chamber 20. For example, the inductively coupled plasma source ICP-P 200 from JE PlasmaConsult, GmbH in Wuppertal, Germany, has been shown to yield Argon and Nitrogen ion energies below 20 eV when operated in the pressure range between $10^{-4}$ and $10^{-2}$ mbar and powers up to 1 kW.

A deposition assembly 50 is electrically insulated from deposition chamber 20 by means of insulators 26. One or more substrate supports 54 are heated from the back by a heating means 52, such as a resistive heater or by lamp heaters. The substrate support 54 is spaced several skin depths (typically 5-20) away from the location of highest plasma density close to the dielectric window 28. The skin depth is on the order of 1 cm for the typical operating pressures used according to the invention. The deposition assembly 50 can either be grounded or left electrically floating. Alternatively, the assembly 50 can be connected to a DC bias power supply, or it can be coupled through an impedance matching network 56 to RF generator 58, giving rise to a DC self-bias. These measures are taken in order to control the electrical potential of substrates 54 with respect to that of the plasma. In this way the electric field component perpendicular to the surface of substrates 54 can be controlled independently from the parameters controlling the plasma 36. The energy of ions impinging on the substrates can thus be adjusted for optimum epitaxial growth conditions.

In addition, the deposition chamber 20 is equipped with one or more metal vapor emitters 40 (effusion cells in the embodiment illustrated) from which metals, such as Ga, In and Al, can be vaporized and the vapors injected into the chamber interior 21. For these metals, the temperature of standard effusion cells used in molecular beam epitaxy (MBE) can easily be adjusted such as to allow much higher evaporation rates than those customary in that technique. For example an increase of Gallium cell temperature by 200° C. was found to be adequate for a 100-fold increase of the GaAs growth rate of 1 monolayer/sec typical in MBE. Similar to MBE, fast-action shutters 42 are controllable to interrupted completely the fluxes from the vapor emitters 40.

During epitaxial deposition, the radio frequency power applied to the induction coils 30 and the gas pressures in the chamber 20 are chosen such that the heated substrates 54 are fully exposed to a low-energy plasma. Typically, gas pressures in chamber 20 range between $10^{-4}$ mbar to 1.0 mbar, with pressures in the range of $10^{-2}$ to $10^{-1}$ mbar being the most typical. Under such conditions, activated nitrogen and metal vapor from effusion cells 40 both move by diffusive transport in the plasma. Metal atoms reacting with the nitrogen form an epitaxial nitride layer on the hot substrates 54.

Figure 2:
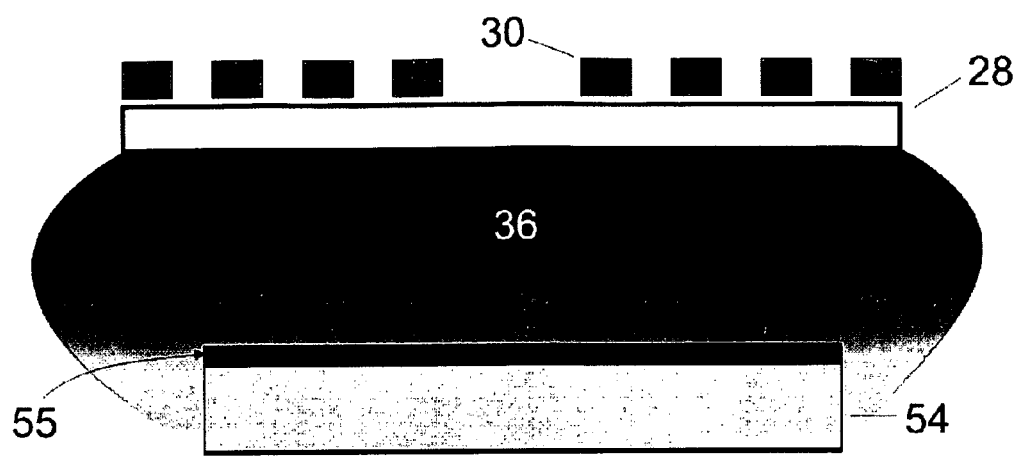
FIG. 2 is a schematic drawing of a growing film on a substrate exposed to a low-energy plasma.

Referring now to FIG. 2, a detailed view of a growing film 55 on a substrate 54 exposed to a low-energy plasma 36 can be seen. The ion density in the plasma decreases exponentially from the dielectric window 28 to the substrate 54. For example for the plasma source "ICP-P 200," the ion density in a nitrogen plasma may still exceed $10^{11}$ cm$^{-3}$ at a substrate located about 10 cm below dielectric window 28, when a nitrogen pressure of $10^{-1}$ mbar at a gas flow of 10 sccm, and a rf-power of 1000 W are used. In order to keep the ion energy low, it may be advantageous to keep the total gas pressure fixed, for example around $10^{-1}$ mbar, by admitting a controlled flow of Ar through gas inlets 22 to enter the vacuum chamber 20 along with nitrogen gas, when nitrogen partial pressures substantially below $10^{-1}$ mbar are used.

As a result of the efficient activation of the reacting species in a dense plasma 36, and intense bombardment of the substrate surface 54 by low-energy ions the substrate temperature can be significantly lowered with respect to the substrate temperatures of 1000° C. and more typical for MOCVD. The problems of layer cracking due to different thermal expansion coefficients of typical substrates (sapphire, silicon carbide and silicon) are hence expected to be greatly reduced.

Figure 3:
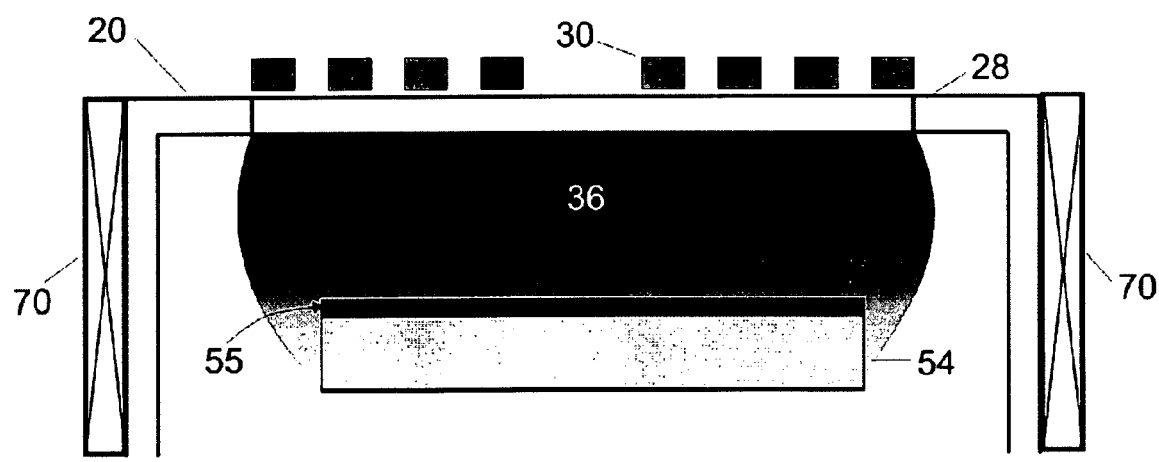
FIG. 3 is a schematic view of a plasma confined by a magnetic field.

Referring now to FIG. 3, a detailed view of part of the vacuum chamber 20 is shown, where in order to confine the plasma 36, and to increase its density and uniformity, the chamber is optionally equipped with coils or permanent magnets 70. The magnetic field generated by these coils or permanent magnets helps in shaping the plasma. Even weak fields of the order of $10^{-3}$ to $10^{-2}$ Tesla are considered to be sufficient to have a beneficial effect.

In a preferred embodiment of the invention no reactive gases are used for epitaxial nitride semiconductor growth at all. Additional cells 40a may contain those doping species which are preferably used in elemental form, such as Mg, Zn and similar metals acting as acceptor impurities. Similarly, dopants acting as donors, such as silicon, may be provided by additional cells 40a. These emitters 40a (effusion cells) also are equipped with fast-acting shutters 42 permitting rapid and complete interruption of the dopant vapors. The preferred substrate support 54 choice is silicon in order to allow for scaling up to 300 mm wafers, and potentially beyond. However, the use of other substrates employed in state of the art techniques is equally possible in the new technique according to the invention.

The combination of effusion cells for metal evaporation with a dense low-energy plasma suitable for epitaxial layer deposition has not been proposed before. We call the new process low-energy plasma enhanced vapor deposition (LEPEVPE). LEPEVPE is a process being operated under completely different conditions with respect to all other known processes, including LEPECVD where a DC plasma discharge and reactive gas phase precursors are used.

In one embodiment of the invention, the region of the vapor emitters 300 is differentially pumped (320 in FIG. 6) in order to exclude thermal reactions with the hot metals inside and diffusive transport in the connecting tube to the deposition chamber. In a preferred embodiment of the invention more than one vapor emitter 40 & 40a (effusion cell) is used per evaporated metal. Each cell can be operated at a different temperature, thereby easily allowing rapid changes in growth rates or doping densities by switching from one cell to another.

In another embodiment of the invention, additional gas lines 23 are used to insert doping gases into the deposition chamber for those doping elements which are preferably applied in gaseous form. The doping gases, such as Silane for n-type doping, are preferably diluted in a non-reactive gas, such as argon. The dynamic range of doping can be increased by using more than one gas line per doping gas. In a preferred embodiment where vapor emitters 40a of only the solid source type are used for doping, the process is operated hydrogen-free. This embodiment is especially desirable for p-doped GaN layers since a hydrogen-free process does not need any dopant activation by thermal annealing. The process of the invention is carbon-free because it does not require any carbon-containing precursor gases.

In the preferred embodiment of the invention illustrated in FIG. 1, the assembly of substrate supports 54 is facing up. This configuration, customarily used in semiconductor processing, facilitates wafer handling and design of the deposition assembly or substrate holder 50. According to the invention, LEPEVPE is characterized by a high density low-energy plasma in direct contact with the surface of the substrate support 54. The surface of the substrate support 54 is therefore under intense bombardment of low-energy ions, the energy of which may be adjusted by appropriate choice of the substrate bias. This is in marked contrast to plasma processing methods using remote plasma sources, which typically deliver radicals only, whereas ion densities at the substrate surface are negligibly low. Heavy substrate bombardment by low-energy ions has been shown to be beneficial to epitaxial growth of device quality semiconductor layers at extremely high growth rates of more than 5 nm/s at substrate temperatures as low as 500° C. (see, for example, von Känel et al., Appl. Phys. Lett. 80, 2922 (2002), the content of which is incorporated herein by reference). According to the invention very high throughputs may therefore be expected by combining LEPEVPE with state of the art wafer handling tools (not shown).

According to the present invention, the apparatus 10 may be used for growing epitaxial III-V semiconductors, especially group III-nitrides onto specially treated single-crystal substrates 54. Possible surface treatments of substrates 54 may involve state of the art chemical pre-cleans, in situ thermal cleans or plasma cleans, followed by in situ formation of epitaxial templates, such as oxides, carbides or low-temperature nitrides, suitable for subsequent epitaxial nitride semiconductor growth.

Figure 4:
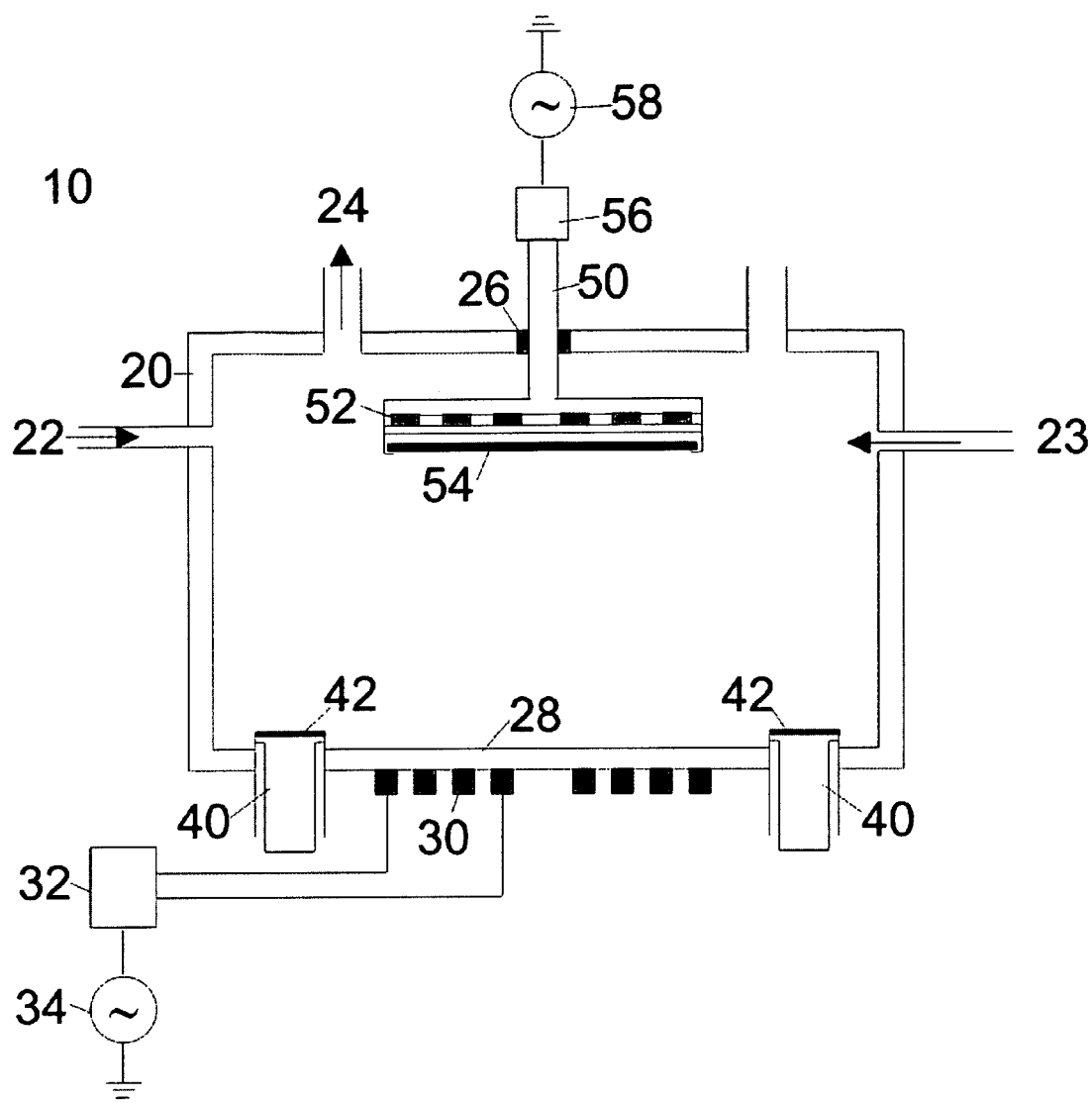
FIG. 4 is a schematic side-view drawing of a variant of a system for LEPEVPE with an ICP source and effusion cells, and with substrate face down.

Referring now to FIG. 4, an apparatus 10 of the resent system is shown in which the substrate support 54 on which the growing materials are deposited is mounted on a table of the substrate holder 50 in the interior chamber 21 which is now facing down. This configuration is characterized by fewer problems with particulate contamination, at the cost of a more complex wafer handling system and design of the substrate holder 50. As noted above, the deposition chamber 20 may be equipped with optional coils or permanent magnets which may help in shaping the plasma, and is similarly equipped with effusion cells 40, etc.

Figure 5:
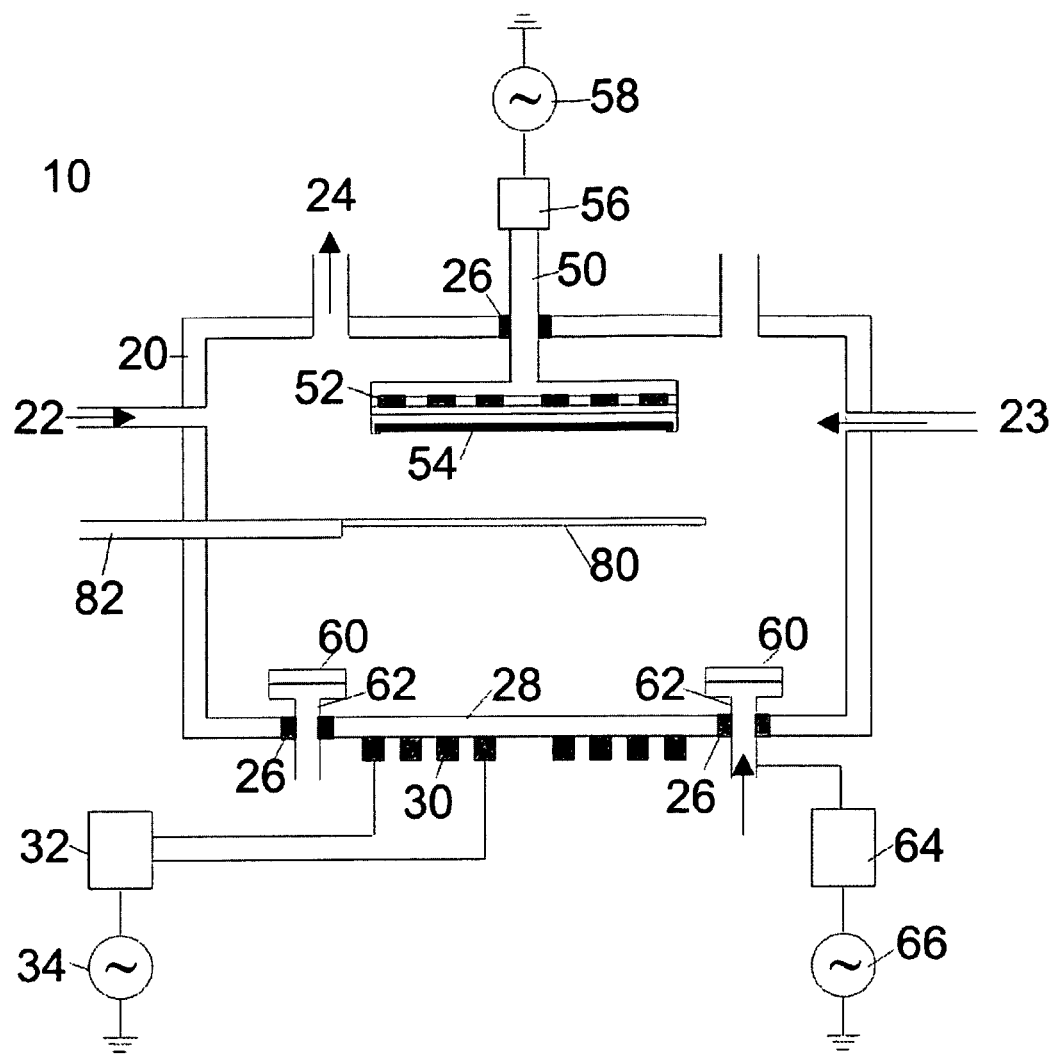
FIG. 5 is a schematic side-view drawing of a system for LEPEVPE with an ICP source and sputter sources.

Referring now to FIG. 5, another embodiment of the invention is shown, whereby the substrate supports 54 mounted on deposition assembly 50 inside the chamber 20 are again facing down. The deposition chamber 20 may be equipped with optional coils or permanent magnets which may help in shaping the plasma (see FIG. 3).

In this embodiment, the elemental metal vapors are supplied to the plasma by means of water cooled sputter sources 60, holding sputter targets 62. It is advisable to arrange the sputter targets 60 in the form of concentric rings or ring segments around the dielectric window 28 of the ICP source. The sputter targets are connected through an impedance match box 64 to an RF power supply 66, whereby power supply 66 provides an alternate voltage at a frequency preferably substantially different to that used by generator 34 to power the ICP coils 30. This reduces undesirable interferences between the two kinds of power sources 34 and 66. In another embodiment of the invention, the sputter sources 60 are powered by a DC power supply. It has been shown that for typical pressures-distance products on the order of $0.2 \times 10^{-2}$ mbar m the thermalization of sputtered particles reaching the substrate is nearly complete, such that electronic-grade semiconductor material can be grown by using sputter sources (see, for example, Sutter et al., Appl. Phys. Lett. 67, 3954 (1995), the content of which is incorporated herein by reference).

In order to allow cleaning of sputter sources 60 prior to epitaxial layer deposition, chamber 20 may be optionally equipped with a movable shutter assembly 82 allowing the shutter blade 80 to be positioned close to and below the substrates 54 and hence avoiding any sputtered particles to reach the substrate during pre-sputtering.

In a preferred embodiment of the invention no reactive gases are used for epitaxial nitride semiconductor growth at all. Additional sputter targets 60a may contain those doping species which are preferably used in elemental form, such as Mg, Zn and similar metals acting as acceptor impurities. Similarly, dopants acting as donors, such as silicon, may be provided by additional sputter targets 60a. In another embodiment of the invention each sputter gun 62 may be equipped with optional shutters (not shown) in order to avoid cross-contamination between the individual targets 60.

During epitaxial deposition, the radio frequency power applied to the induction coils 30 and the gas pressures in the chamber 20 are chosen such that the heated substrates 54 are fully exposed to a low-energy plasma. Typically, gas pressures in chamber 20 range between $10^{-3}$ mbar to $10^{-1}$ mbar, with pressures in the range of $10^{-2}$ to $10^{-1}$ mbar being the most typical. Under such conditions, activated nitrogen and metal vapor from sputter guns 62 both move by diffusive transport in the plasma and the process proceeds as noted above.

In another embodiment of the invention sputter guns 62 may be combined with effusion cells 40, whereby both sources are preferably arranged symmetrically around the dielectric window 28. The combination of effusion cells and sputter guns for evaporating reactants and dopants in elemental form with a dense low-energy plasma suitable for epitaxial layer deposition has not been proposed before. In a preferred embodiment of the invention more than a single sputter gun 62 and effusion cell 40 are used per evaporated metal. Each source can be operated in such a way as to deliver a different flux of metal vapors, thereby easily allowing rapid changes in growth rates or doping densities by switching from one source to another. In still another embodiment, the effusion cells 40 and sputter guns 62 may be replaced or complemented by electron beam evaporators. Electron beam evaporators are especially suitable for evaporating elements with low vapor pressures, where significant fluxes are difficult to achieve with effusion cells 40.

Figure 6:
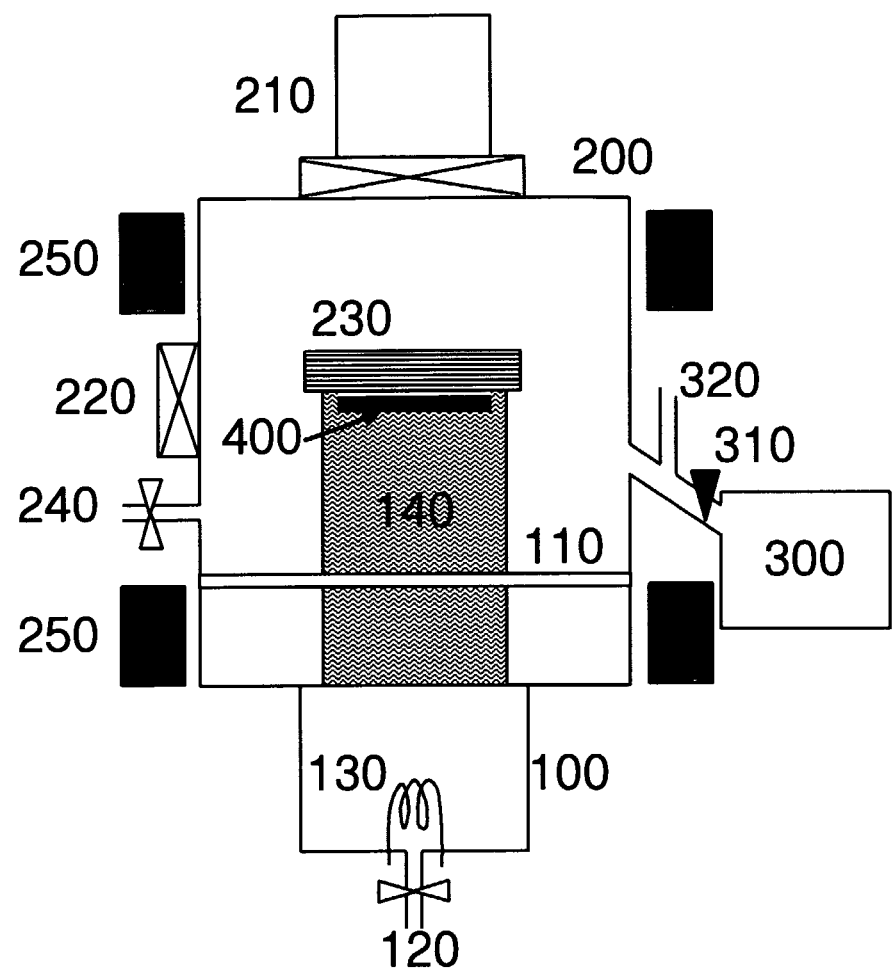
FIG. 6 is a schematic drawing representing a system of the present invention for LEPEVPE with a DC plasma source and effusion cells.

Referring now to FIG. 6, another embodiment of the invention is shown, in which the apparatus 10 includes a broad area plasma source 100 with an assembly of thermionic cathodes 130, an inert gas inlet 120, and an integrated or separate anode 110. Preferably, the voltage difference between the cathodes 130 and the anode 110 is less than 30 V, to provide that ions striking the substrate have energy less than about 20 V. The plasma source 100 in which an arc plasma 140 can be ignited is attached to a deposition chamber 200. The deposition chamber, equipped with a load-lock 220, is pumped for example by a turbomolecular pump 210 communicating with chamber 200 by means of valve 205, and contains a substrate heater assembly 230. Gas lines 240 for injecting an inert gas such as nitrogen, and additional gases, such as hydrogen, are connected to the deposition chamber. The plasma density may be changed rapidly by changing the confining magnetic field produced by coils 250.

In addition, this chamber is equipped with effusion cells 300 from which metals can be vaporized, such as Ga, In and Al. Additional cells 300 may contain those doping species which are preferably used in elemental form, such as Mg, Zn and similar metals acting as acceptor impurities. The effusion cells are equipped with shutters 310 permitting complete interruption of the metal vapor.

The heated assembly of substrates 400 is fully exposed to the low-energy plasma generated by the arc discharge in the plasma source and expanding into the deposition chamber through the permeable anode 110. The arc discharge is sustained by thermionic cathodes 130 in the plasma chamber 200, and can be operated in a wide pressure range in the deposition chamber from $10^{-4}$ mbar to at least $10^{-1}$ mbar, with pressures in the range of $10^{-2}$ mbar being the most typical. Plasma activated nitrogen flowing through the deposition chamber reacts with the metal vapor, forming an epitaxial nitride film on the substrate 400.

Effusion cells are normally used for evaporating metals in ultra-high vacuum for example in a molecular beam epitaxy system. Here, they serve to introduce a metal vapor into a high-density low-energy plasma generated at typical pressures of about $10^{-2}$ mbar at which transport is diffusive. LEPEVPE is hence a process being operated under completely different conditions with respect to other processes. In one embodiment of the invention, the region of the effusion cells 300 is differentially pumped 320 in order to exclude thermal reactions with the hot metals inside and diffusive transport in the connecting tube to the deposition chamber.

In a preferred embodiment of the invention more than a single effusion cell 300 is used per evaporated metal. Each cell can be operated at a different temperature, thereby easily allowing rapid changes in growth rates or doping densities by switching from one cell to another. In addition, changes of the plasma density, brought about by changing the magnetic field produced by the coils 250, can further enhance the dynamic range of growth rates.

In another embodiment of the invention, additional gas lines 240a are used to insert doping gases into the deposition chamber for those doping elements which are preferably applied in gaseous form. The doping gases, such as Silane for n-type doping, are preferably diluted in a non-reactive gas, such as argon. The dynamic range of doping can be increased by using more than one gas line per doping gas.

The process of the invention is carbon-free because it does not require any carbon-containing precursor gases. In a preferred embodiment, it is also operated hydrogen-free. This embodiment is especially desirable for p-doped GaN layers since a hydrogen-free process does not need any dopant activation by thermal annealing.

Since LEPEVPE is a plasma-activated process it can be operated at lower substrate temperatures than competing techniques where tensile stress induced by different thermal expansion coefficients of epilayer and substrate often lead to undesirable crack formation during cooling from the growth temperature.

ANNEX A—the below documents are incorporated herein by reference thereto and relied upon.

| US patent documents | | |
|---|---|---|
| 6,472,300 | October 2002 | Nikolaev et al. |
| 6,706,119 | March 2004 | Tsvetkov et al. |
| 6,818,061 | November 2004 | Peczalski et al. |
| 5,633,192 | May 1997 | Moustakas et al. |
| 6,454,855 | September 2002 | von Känel et al. |
| 6,918,352 | July 2005 | von Känel et al. |
| 5,580,420 | December 1996 | Watanabe et al. |
| 4,368,092 | January 1983 | Steinberg et al. |
| 4,948,458 | August 1990 | Ogle |
| 6,811,611 | November 2004 | Johnson |
| 5,788,799 | August 1998 | Steger et al. |

| Other patent documents | | |
|---|---|---|
| WO 2006/000846 | January 2006 | von Känel et al. |

Additional publications.

J. D. Brown et al., "AlGaN/GaN HFETs fabricated on 100-mm GaN on silicon(111) substrates", Solid-State Electronics, Vol. 46, No. 10 (October 2002) pp. 1535-1539.

S. Nakamura, "InGaN-based laser diodes", Annual Reviews on Material Science, Vol. 28 (1998) pp. 125-152.

S. Nakamura, "The roles of structural imperfections in InGaN-based blue light-emitting diodes and laser diodes", Science, Vol. 281 (14 Aug. 1998) pp. 956-961.

G. A. Smith et al., "341 nm emission from hydride vapor-phase epitaxy ultraviolet light-emitting diodes", Journal of Applied Physics, Vol. 95, No. 12 (15 Jun. 2004) pp. 8247-8251.

R. F. Davis et al., "Gallium nitride materials—progress, status, and potential roadblocks", Proceedings of the IEEE, Vol. 90, No. 6 (June 2002) pp. 993-1004.

A. Dadgar et al., "Metalorganic chemical vapor phase epitaxy of gallium-nitride on silicon", physica status solidi (c), Vol. 0, No. 6 (September 2003) pp. 1583-1606.

T. Wang et al., "Electron mobility exceeding $10^4$ cm$^2$/Vs in an AlGaN—GaN heterostructure grown on a sapphire substrate", Applied Physics Letters, Volume 74, No. 23 (7 Jun. 1999) pp. 3531-3533.

J. Bläsing et al., "The origin of stress reduction by low-temperature AlN interlayers", Applied Physics Letters, Vol. 81, No. 15 (7 Oct. 2002) pp. 2722-2724.

C. R. Elsass, "Electron transport in AlGaN/GaN heterostructures grown by plasma-assisted molecular beam epitaxy", Japanese Journal of Applied Physics, Vol. 39, Part 2, No. 10B (15 Oct. 2000) pp. L1023-L1025.

C. Rosenblad et al., "Silicon epitaxy by low-energy plasma enhanced chemical vapor deposition", Journal of Vacuum Science and Technology A, Vol. 16, No. 5 (September/October 1998), pp. 2785-2790.

Heung-Sik Tae et al., "Low-temperature silicon homoepitaxy by ultrahigh vacuum electron cyclotron resonance chemical vapor deposition", Applied Physics Letters, Vol. 64, No. 8 (21 Feb. 1994) pp. 1021-1023.

C. B. Vartuli et al., "ICl/Ar electron cyclotron resonance plasma etching of III-V nitrides", Applied Physics Letters, Vol. 69, No. 10 (2 Sep. 1996), pp. 1426-1428.

W. Z. Collison et al., "Studies of the low-pressure inductively-coupled plasma etching for a larger wafer using plasma modeling and Langmuir probe", Jornal of Vacuum Science and Technology A, Vol. 16, No. 1 (January/February 1998), pp. 100-107.

R. J. Shul et al., "Inductively coupled plasma etching of GaN", Applied Physics Letters, Vol. 69, No. 8 (19 Aug. 1996), pp. 1119-1121.

J. Hopwood, "Review of inductively coupled plasmas for plasma processing". Plasma Source Science and Technology, Vol. 1, No. 2 (May 1992) pp. 109-116.

D. S. Green et al., "Carbon doping of GaN with CBr$_4$ in radio-frequency plasma-assisted molecular beam epitaxy", Journal of Applied Physics, Vol. 95, No. 12 (15 Jun. 2004) pp. 8456-8462.

H. von Känel, "Very high hole mobilities in modulation-doped Ge quantum wells grown by low-energy plasma enhanced chemical vapor deposition", Applied Physics Letters, Vol. 80, No. 16 (22 Apr. 2002), pp. 2922-2924.

P. Sutter et al., "Quantum transport in sputtered, epitaxial Si/Si$_{1-x}$Ge$_x$ heterostructures, Applied Physics Letters, Vol. 67, No. 26 (25 Dec. 1995), pp. 3954-3956.

What is claimed is:

1. A vacuum system for semiconductor epitaxy, the system comprising:
   a. a pressure-controlled deposition chamber that maintains pressure above 10^-3 mbar up to about 1 mbar during epitaxial deposition;
   b. a substrate holder within the deposition chamber whereby a substrate is removably attached;
   c. sources that vaporizes substances into vapor particles and discharge the same to the deposition chamber, such vapor particles including elemental metals, metal alloys and dopants;
   d. a gas supply system that supplies gases to the deposition chamber; and
   e. a plasma source that supplies a suitable plasma to the deposition chamber, the discharge of the sources being disposed with respect to the substrate holder so as to enable direct contact with the substrate;
   wherein the system is adapted to propagate gas and vapor particles diffusively in the deposition chamber, the gas and particles being activated by the plasma, so as to react and form a uniform epitaxial layer on a heated substrate fixed to the substrate holder by low-energy plasma enhanced vapor phase epitaxy.

2. The system of claim 1, wherein the plasma source is selected from a group consisting of inductively coupled plasma (ICP) sources and low-voltage arc discharge sources.

3. The system of claim 1, wherein the sources for vaporizing substances supplying elemental metal and metal alloy vapors are chosen from a group of sources capable of delivering vapor fluxes.

4. The system of claim 1, wherein the dopant sources are chosen from a group of sources consisting of effusion cells, splitter sources and reactive gas sources.

5. The system of claim 1, wherein the gases supplied to the deposition region by the gas distribution system are non-toxic, non-reactive gases.

6. The system of claim 2, wherein the ICP source includes a spiral inductive coupler.

7. The system of claim 2, wherein the plasma source is a direct-current plasma source containing one or more thermionic cathode; and
   wherein the assembly of cathodes in the plasma source communicates with an anode permeable to the plasma.

8. The system of claim 7, wherein the direct current plasma source is a broad-area source whereby the region of plasma extraction is formed by a shower head, and whereby said shower head communicates with the permeable anode that forms a uniform plasma density in the deposition region.

9. The system of claim 1, wherein the gases activated by the plasma are allowed to react in the deposition region with plasma activated metal vapors, thereby forming an epitaxial template layer, on heated substrates fixed to the heated substrate holder, which template layer is of a quality sufficient for subsequent epitaxy of nitride semiconductor layers.

10. The system of claim 1, wherein nitrogen gas is supplied to the deposition region by the gas distribution system and activated by the plasma and allowed to react in the deposition region with plasma activated metal vapors chosen among a group of metals comprising Ga, In, and Al, thereby forming an epitaxial nitride semiconductor layer on substrates held by the heated substrate holder.

11. The system of claim 1, wherein the dopant sources contain elements chosen among a group of elements, comprising Si, Mg, Zn, Be, and Cd.

12. The system of claim 1, further equipped with shutters permitting interruption of a flux of the metal and dopant vapors.

13. The system of claim 1, wherein at least one of the sources is differentially pumped.

14. The system of claim 1, wherein more than one source is provided for use with each evaporated substance, and wherein the sources used for the same substance are adapted to yield different fluxes of vapor particles in operation.

15. The system of claim 4, wherein the system is adapted to feed doping gases into the deposition chamber.

16. The system of claim 2, wherein the plasma source is a low voltage arc discharge source wherein the arc voltage is below 30 V, wherein ions striking the substrate have energy less than about 20 V.

17. The system of claim 1, further comprising a magnetic field generator that changes the magnetic field strength at the substrate position enabling rapid changing of the plasma density at the substrate.

18. The system of claim 1, further comprising a magnetic field generator that periodically changes the direction of the magnetic field.

19. The system of claim 3, wherein the sources for vaporizing substances supplying elemental metal and metal alloy vapors include effusion cells.

20. The system of claim 3, wherein the sources for vaporizing substances supplying elemental metal and metal alloy vapors include sputter sources.

21. The system of claim 5, wherein the gas supplied to the deposition region by the gas distribution system is argon.

22. The system of claim 5, wherein the gas supplied to the deposition region by the gas distribution system is nitrogen.

23. The system of claim 15, wherein the doping gases are silane diluted with an inert gas.

* * * * *